(12) United States Patent
Chyurlia

(10) Patent No.: US 11,373,959 B2
(45) Date of Patent: Jun. 28, 2022

(54) SHIELDING FOR FLIP CHIP DEVICES

(71) Applicant: SKYWORKS SOLUTIONS, INC., Woburn, MA (US)

(72) Inventor: Pietro Natale Alessandro Chyurlia, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/852,453

(22) Filed: Apr. 18, 2020

(65) Prior Publication Data

US 2020/0335455 A1 Oct. 22, 2020

Related U.S. Application Data

(60) Provisional application No. 62/836,512, filed on Apr. 19, 2019.

(51) Int. Cl.
H01L 23/552 (2006.01)
H01L 23/66 (2006.01)
H01L 23/00 (2006.01)
H01L 23/31 (2006.01)

(52) U.S. Cl.
CPC ........ *H01L 23/552* (2013.01); *H01L 23/3114* (2013.01); *H01L 23/66* (2013.01); *H01L 24/45* (2013.01); *H01L 24/94* (2013.01); *H01L 2223/6611* (2013.01)

(58) Field of Classification Search
CPC ... H01L 23/552; H01L 23/3114; H01L 23/66; H01L 24/45; H01L 24/94; H01L 2223/6611

USPC ......................................................... 257/659
See application file for complete search history.

(56) References Cited

U.S. PATENT DOCUMENTS

| | | | | |
|---|---|---|---|---|
| 2006/0091517 A1* | 5/2006 | Yoo | ...................... | H01L 23/3128 257/686 |
| 2009/0284947 A1* | 11/2009 | Beddingfield | .... | H01L 23/49833 361/818 |
| 2011/0204494 A1* | 8/2011 | Chi | ......................... | H01L 21/56 257/659 |
| 2011/0304015 A1* | 12/2011 | Kim | ...................... | H01L 25/105 257/532 |
| 2012/0086109 A1* | 4/2012 | Kim | ...................... | H01L 21/561 257/659 |
| 2014/0002188 A1* | 1/2014 | Chen | .................... | H01L 23/481 330/250 |
| 2015/0061151 A1* | 3/2015 | Kuo | ...................... | H01L 23/481 257/774 |
| 2016/0073490 A1* | 3/2016 | Branchevsky | ....... | H05K 3/4644 361/783 |
| 2017/0127581 A1* | 5/2017 | Figueredo | ............. | H01L 23/552 |
| 2019/0181079 A1* | 6/2019 | Lakhera | .................. | H01L 23/10 |

\* cited by examiner

*Primary Examiner* — Didarul A Mazumder

(74) *Attorney, Agent, or Firm* — Chang & Hale LLP

(57) ABSTRACT

Shielding for flip chip devices. In some embodiments, a shielded assembly can include a substrate and a flip chip die having a front side and a back side, with the including an integrated circuit implemented on the front side, and the front side of the flip chip die being mounted to the substrate. The shielded assembly can further include a shielding component implemented over the back side of the flip chip die to provide electromagnetic shielding between a first region within or on the flip chip die and a second region away from the flip chip die.

15 Claims, 11 Drawing Sheets

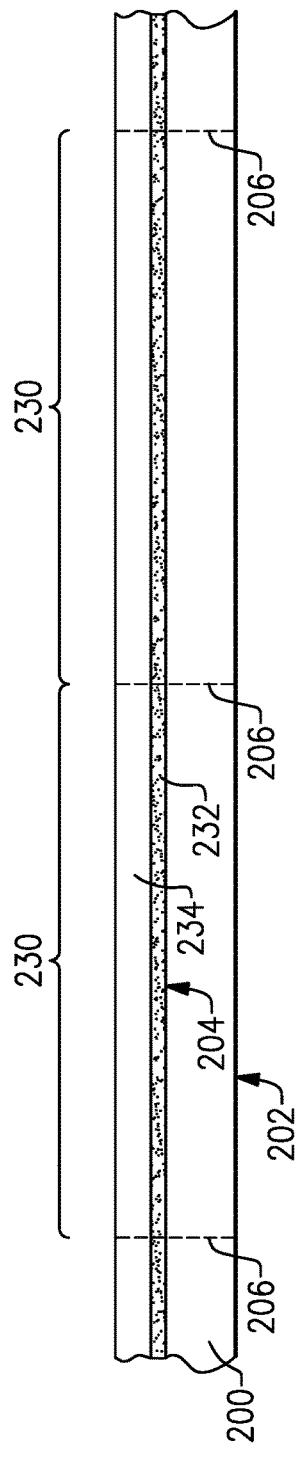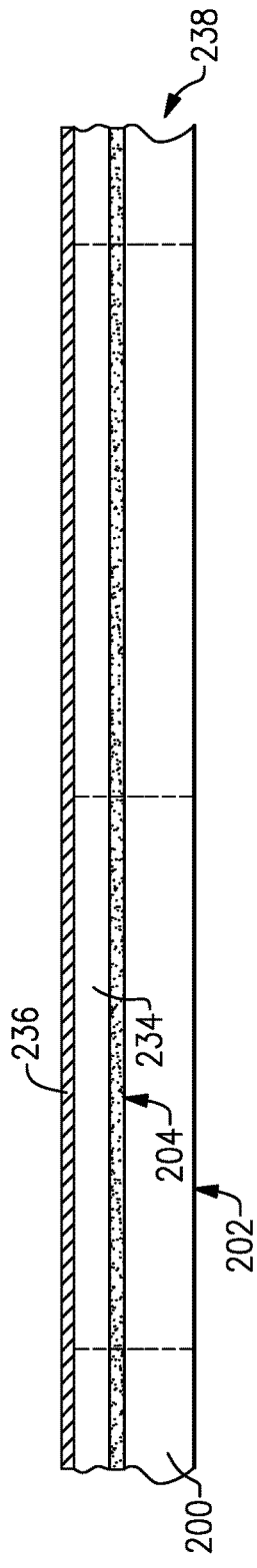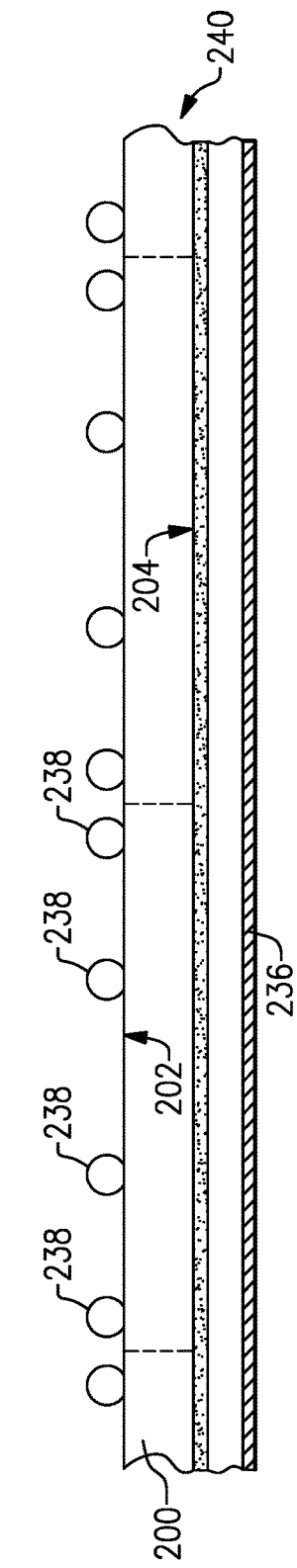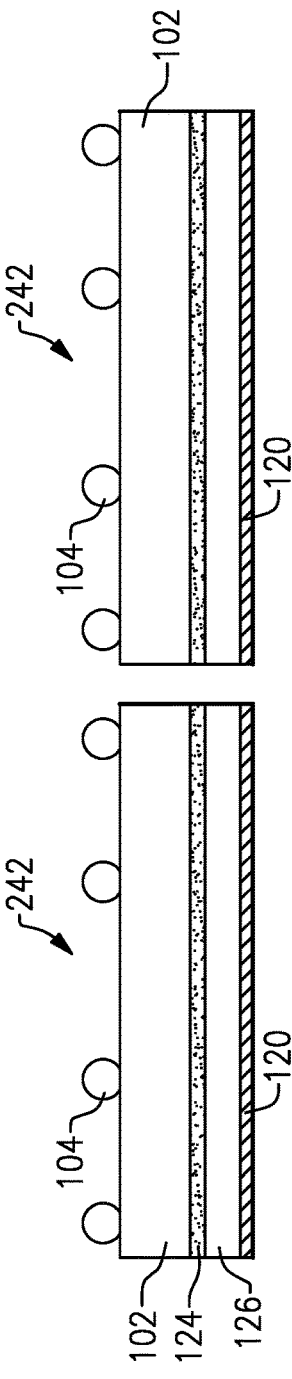

SHIELDING FOR FLIP CHIP DEVICES

CROSS-REFERENCE TO RELATED APPLICATION(S)

This application claims priority to U.S. Provisional Application No. 62/836,512 filed Apr. 19, 2019, entitled SHIELDING FOR FLIP CHIP DEVICES, the disclosure of which is hereby expressly incorporated by reference herein in its respective entirety.

BACKGROUND

Field

The present disclosure relates to electromagnetic shielding for electronic chips.

Description of the Related Art

In radio-frequency (RF) applications, circuits are commonly implemented on devices such as semiconductor die, also sometimes referred to as chips. In operation, an RF circuit can be subjected to electromagnetic interference (EMI) from an external source, and/or be an EMI source itself.

SUMMARY

In accordance with a number of implementations, the present disclosure relates to a shielded assembly that includes a substrate. The shielded assembly further includes a flip chip die having a front side and a back side, and including an integrated circuit implemented on the front side, with the front side of the flip chip die being mounted to the substrate. The shielded assembly further includes a shielding component implemented over the back side of the flip chip die to provide electromagnetic shielding between a first region within or on the flip chip die and a second region away from the flip chip die.

In some embodiments, the substrate can include a circuit board such a phone board. In some embodiments, the substrate can include a packaging substrate, and the shielded assembly can be implemented as a packaged module.

In some embodiments, the shielding component can include a conductive layer implemented over the back side of the flip chip die. The conductive layer can be electrically connected to a ground plane of the packaging substrate. In some embodiments, the shielding component can further include one or more shielding wirebonds implemented to provide the electrical connection between the conductive layer and the ground plane of the packaging substrate. The one or more shielding wirebonds can include a plurality of shielding wirebonds arranged partially or fully around the flip chip die. Neighboring pairs of the shielding wirebonds can be spaced to provide electromagnetic shielding between the first region and the second region that includes a side region outside of the shielding wirebonds.

In some embodiments, the conductive layer can include a metal layer. In some embodiments, the metal layer can be directly on the back side of the flip chip die.

In some embodiments, the shielded assembly can further include an intermediate layer implemented between the back side of the flip chip die and the metal layer. In some embodiments, the metal layer can be directly on the corresponding side of the intermediate layer. In some embodiments, the intermediate layer can include a carrier wafer layer formed from material such as semiconductor or glass.

In some embodiments, the carrier wafer layer can have lateral dimensions that are equal to or lesser than corresponding lateral dimensions of the flip chip die. In some embodiments, the carrier wafer layer can have lateral dimensions that are greater than corresponding lateral dimensions of the flip chip die.

In some embodiments, the shielding component can include an absorber layer implemented over the back side of the flip chip die, with the absorber layer being configured to absorb some or all of an electromagnetic energy incident on the absorber layer.

In some embodiments, the absorber layer can be directly on the back side of the flip chip die.

In some embodiments, the shielded assembly can further include an intermediate layer implemented between the back side of the flip chip die and the absorber layer. In some embodiments, the absorber layer can be directly on the corresponding side of the intermediate layer. In some embodiments, the intermediate layer can include a carrier wafer layer formed from material such as semiconductor or glass.

In some embodiments, the carrier wafer layer can have lateral dimensions that are equal to or lesser than corresponding lateral dimensions of the flip chip die. In some embodiments, the carrier wafer layer can have lateral dimensions that are greater than corresponding lateral dimensions of the flip chip die.

In some embodiments, the absorber layer can include a microwave absorber material.

In some embodiments, the integrated circuit can include a power amplifier circuit. In some embodiments, the power amplifier circuit can include one or more harmonic trap circuits.

In some implementations, the present disclosure relates to a packaged module that includes a packaging substrate configured to receive a plurality of components. The packaged module further includes a flip chip die having a front side and a back side, and including an integrated circuit implemented on the front side, with the front side of the flip chip die being mounted to the packaging substrate. The packaged module further includes a shielding component implemented over the back side of the flip chip die to provide electromagnetic shielding between a first region within or on the flip chip die and a second region away from the flip chip die.

In some embodiments, the packaged module can further include an additional flip chip die having a front side and a back side, and including an integrated circuit implemented on the front side, with the front side of the flip chip die being mounted to the packaging substrate. In some embodiments, the packaged module can further include a shielding component implemented over the back side of the additional flip chip die to provide electromagnetic shielding between a first region within or on the additional flip chip die and a second region away from the additional flip chip die.

According to some teachings, the present disclosure relates to a radio-frequency device that includes a radio circuit and a shielded assembly in communication with the radio circuit and configured to process a signal. The shielded assembly includes a substrate. The shielded assembly further includes a flip chip die having a front side and a back side, and including an integrated circuit implemented on the front side, with the front side of the flip chip die being mounted to the substrate. The shielded assembly further includes a shielding component implemented over the back side of the flip chip die to provide electromagnetic shielding between a first region within or on the flip chip die and a second region away from the flip chip die. The radio-frequency device further includes an antenna in communication with the shielded assembly and configured to support either or both of transmit and receive operations.

In some embodiments, the radio circuit can include a transmitter, and the signal processed by the shielded assembly can include a transmit signal. In some embodiments, the integrated circuit of the flip chip die can include a power amplifier.

In some embodiments, the radio circuit can include a receiver, and the signal processed by the shielded assembly includes a received signal. In some embodiments, the integrated circuit of the flip chip die can include a low-noise amplifier.

In some embodiments, the shielded assembly can further include an additional flip chip die having a front side and a back side, and a shielding component implemented over the back side of the additional flip chip die to provide electromagnetic shielding between a first region within or on the additional flip chip die and a second region away from the additional flip chip die.

In some embodiments, the radio-frequency device can be a wireless device such as a cellular phone. In some embodiments, the substrate can be part of a phone board. In some embodiments, the substrate can be a packaging substrate of a module.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIGS. 19A-19D show various example steps in a process for fabricating a plurality of assemblies with each assembly including a flip chip die, an intermediate layer and a conductive layer.

DETAILED DESCRIPTION OF SOME EMBODIMENTS

The headings provided herein, if any, are for convenience only and do not necessarily affect the scope or meaning of the claimed invention.

Figure 1:
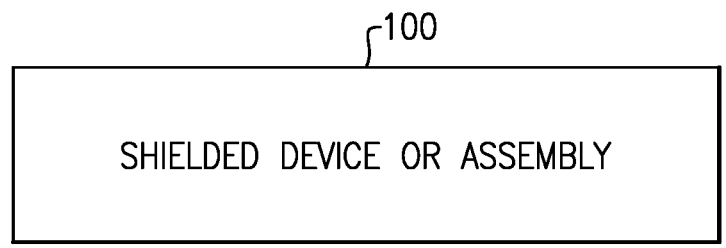
FIG. 1 depicts a radio-frequency (RF) device or assembly having a shielding functionality.

FIG. 1 depicts a radio-frequency (RF) device or assembly 100 having a shielding functionality. As described herein, such a shielded device or assembly can include one or more flipped chips implemented to facilitate such shielding functionality.

Figure 2:
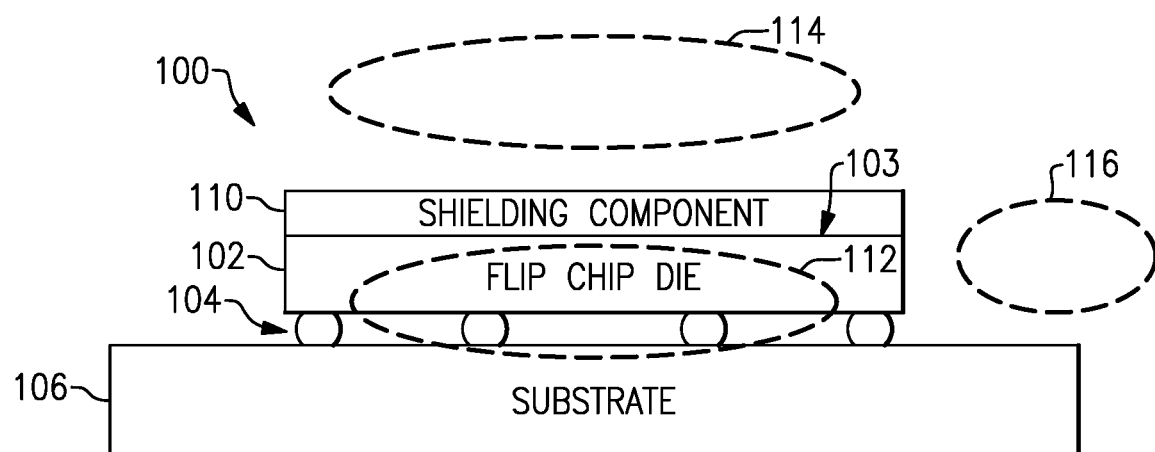
FIG. 2 depicts a side view of a device or assembly that can be a more specific example of FIG. 1.

FIG. 2 depicts a side view of a device or assembly 100 that can be a more specific example of FIG. 1. For the purpose of description, it will be understood that the device or assembly 100 may be referred to as simply a device, as simply an assembly, or any combination thereof.

In the example of FIG. 2, the assembly 100 is shown to include a flip chip die 102 having an integrated circuit implemented therein. A front side of such a flip chip die is shown to be mounted on a substrate 106 with a plurality of solder bumps 104. The assembly 100 can further include a shielding component 110 implemented at least on a back side 103 of the flip chip die 102. Various examples of such a shielding component are described herein in greater detail.

In various examples, flip chips are described herein as being mounted with solder bumps. However, it will be understood that one or more features of the present disclosure can also be implemented utilizing other mounting structures, such as conductive pillars (e.g., copper pillars).

Configured in the foregoing manner, the shielding component 110 can provide a shielding functionality between a region 112 below the shielding component 110 (when oriented as in FIG. 2) and a region 114 above the shielding component 110. In some embodiments, the region 112 below the shielding component 110 can include some or all of the integrated circuit of the flip chip die 102. In some embodiments, such a region 112 below the shielding component 110 may or may not include a region below the front side of the flip chip die 102.

In some embodiments, the shielding component 110 can include a side shielding component. For such embodiments, the shielding component 110 can provide a shielding functionality between the region 112 associated with the flip chip die 102 and one or more side regions 116 outside of the flip chip die 102.

For the purpose of description, a shielding component is associated with an unshielded side and a shielded side, and provides a reduction in electromagnetic field strength on the shielded side when an electromagnetic signal or noise is present on the unshielded side. Such a reduction in field strength can be a partial or full reduction. By way of examples, such a shielding component can provide shielding functionality by partial or full blocking, partial or full termination, and/or partial or full absorption of an electromagnetic signal or noise present on the unshielded side. In some embodiments, blocking can be achieved by one or more conductive features reflecting some or all of incident electromagnetic energy. In some embodiments, termination can be achieved by, for example, grounding of one or more conductive features to terminate to the ground some or all of incident electromagnetic energy. In some embodiments, absorption can be achieved by one or more features having absorbing material so as to absorb some or all of incident electromagnetic energy. In some embodiments, the foregoing absorbing material can include, for example, a microwave absorber material.

For the purpose of description, it will be understood that a shielding functionality as described herein can include blocking, termination, and/or absorption of an electromagnetic signal or noise incident on one side of a shielding component so as to desirably protect the other side of the shielding component. For example, and referring to FIG. 2, if an electromagnetic signal or noise originates within the region 112 associated with the flip chip 102, then such an electromagnetic signal or noise can be blocked, terminated, and/or absorbed by the shielding component 110 so as to protect either or both of the regions 114, 116 outside of the flip chip 102. In another example, if an electromagnetic signal or noise originates from a region outside of the flip chip 102 (e.g., region 114 or 116), then such an electromagnetic signal or noise can be blocked, terminated, and/or absorbed by the shielding component 110 so as to protect the region 112 associated with the flip chip 102.

By way of a more specific example, suppose that the flip chip die 102 of FIG. 2 includes a power amplifier circuit for wireless applications. In such an example context, it is noted that a high power amplifier circuit can radiate RF energy, especially at frequencies in which there are resonant structures. For example, harmonic traps can be implemented at an output of a high power stage, and a low RF impedance associated with such harmonic traps can make them very good radiators. Thus, such radiated energy can be problematic if not shielded.

Figure 3:
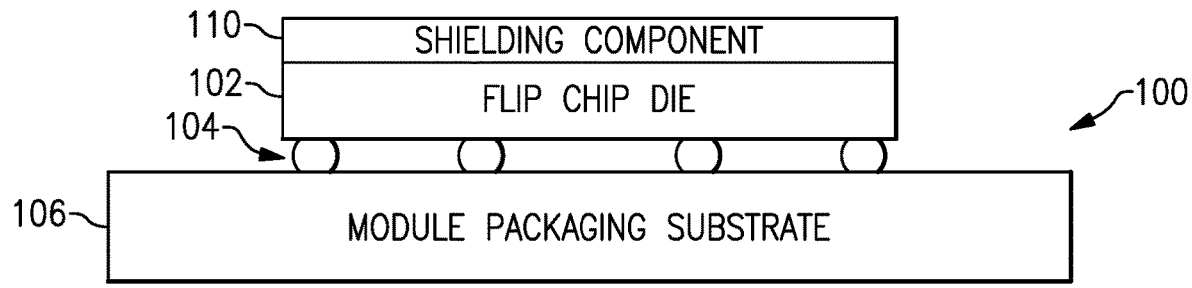
FIG. 3 shows that in some embodiments, an assembly can include a flip chip die and a corresponding shielding component mounted on a packaging substrate.
Figure 4:
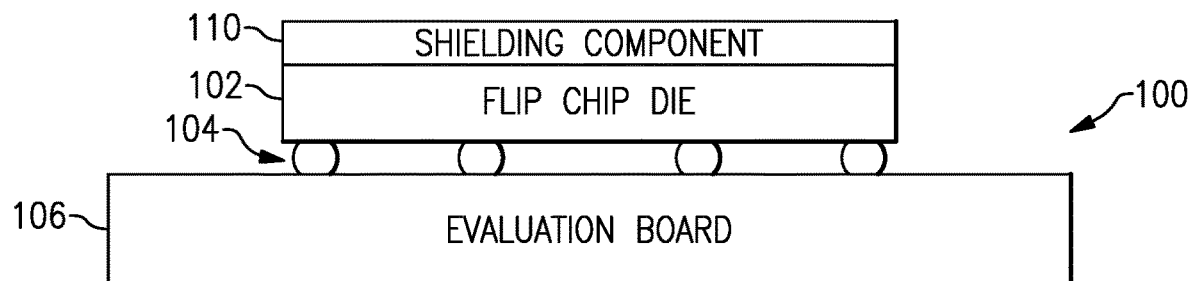
FIG. 4 shows that in some embodiments, an assembly can include a flip chip die and a corresponding shielding component mounted on an evaluation board.
Figure 5:
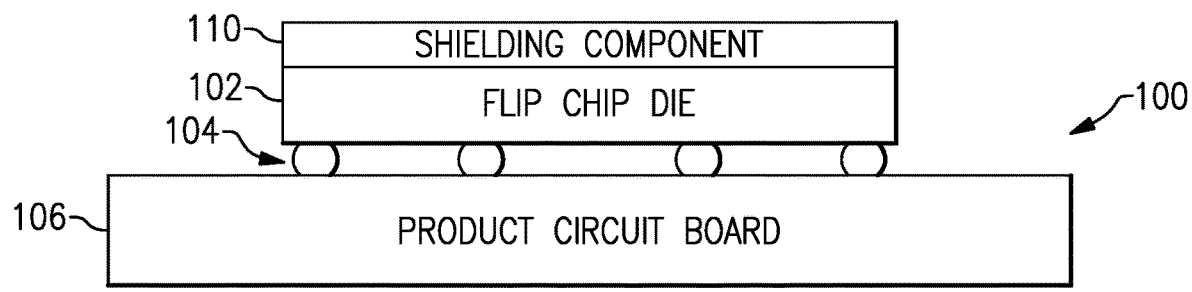
FIG. 5 shows that in some embodiments, an assembly can include a flip chip die and a corresponding shielding component mounted directly on circuit board without further packaging.

FIGS. 3-5 show non-limiting examples of how the assembly 100 of FIG. 2 can be implemented. For example, FIG. 3 shows that in some embodiments, an assembly 100 can include a flip chip die 102 and a corresponding shielding component 110 mounted on a packaging substrate 106. In such embodiments, the resulting assembly 100 can be, for example, a packaged module having shielding functionality. In some embodiments, such a packaged module can also include an overmold implemented over the packaging substrate 106 to thereby encapsulate and protect the flip chip die 102 and the shielding component 110.

In another example, FIG. 4 shows that in some embodiments, an assembly 100 can include a flip chip die 102 and a corresponding shielding component 110 mounted on an evaluation board 106. In such embodiments, the resulting assembly 100 can be utilized to evaluate the flip chip die while providing shielding functionality.

In yet another example, FIG. 5 shows that in some embodiments, an assembly 100 can include a flip chip die 102 and a corresponding shielding component 110 mounted directly on circuit board 106 without further packaging. In such embodiments, the resulting assembly 100 can provide one or more functionalities associated with the flip chip die 102 and provide shielding functionality while mounted directly on the circuit board 106.

FIGS. 6-12 various examples where the shielding component 110 of FIG. 2 includes a conductive layer 120 implemented on a back side 103 of a flip chip die 102, and a side shielding component having one or more shielding wirebonds 130. In such examples, the flip chip die 102 is assumed to be mounted on a substrate 106 with a plurality of solder bumps 104. It will be understood that in some embodiments, the substrate 106 in the examples of FIGS. 6-11 can be any of the example substrates described herein in reference to FIGS. 3-5.

Figure 6:
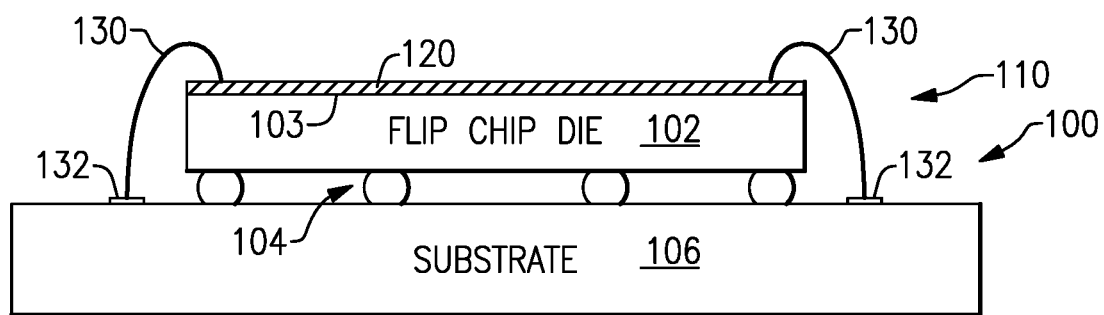
FIG. 6 shows that in some embodiments, a conductive layer for providing shielding functionality can be implemented directly on a back side of a flip chip die.
Figure 7:
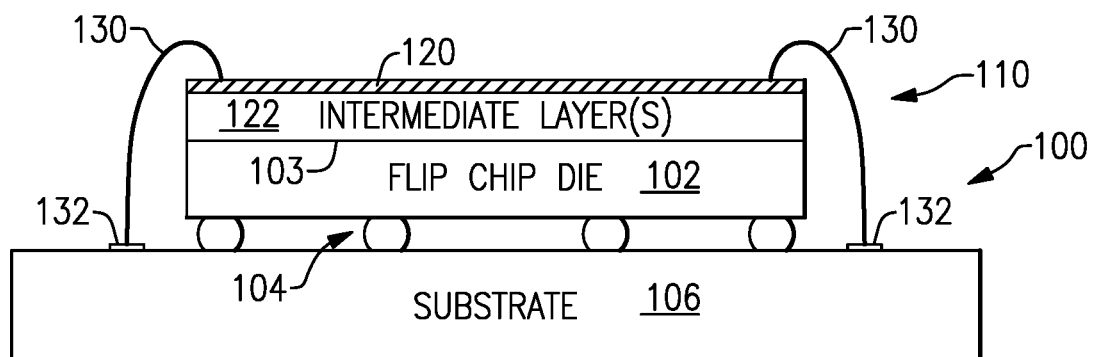
FIG. 7 shows that in some embodiments, a conductive layer for providing shielding functionality can be implemented on an intermediate layer, such that the intermediate layer is between a back side of a flip chip die and the conductive layer.

FIG. 6 shows that in some embodiments, a conductive layer 120 can be implemented directly on a back side 103 of a flip chip die 102. FIG. 7 shows that in some embodiments, a conductive layer 120 can be implemented on an intermediate layer 122, such that the intermediate layer 122 is between a back side 103 of a flip chip die 102 and the conductive layer 120.

Referring to the example of FIG. 6, in some embodiments, the conductive layer 120 can be a metal layer formed while the flip chip die 102 is part of an array of un-singulated die (e.g., in a wafer form). In some embodiments, such a metal layer can be formed before a dicing step, by a number of metallization techniques such as deposition, plating, painting, etc. Such a metallization step can be performed before or after a bumping step where solder bumps 104 are formed.

Referring to the example of FIG. 6, in some embodiments, one or more shielding wirebonds 130 can be formed between the conductive layer 120 and a ground plane that is on or within the substrate 106. In some embodiments, such shielding wirebond(s) can be formed after mounting of an assembly (of the flip chip die and the conductive layer 120 thereon) on the substrate 106.

For example, each shielding wirebond 130 can be formed between the upper surface of the conductive layer 120 and a corresponding contact pad 132, and the contact pad 132 can be electrically connected to the ground plane of the substrate 106. Thus, each shielding wirebond 130 provides an electrical connection between the conductive layer 120 and the ground plane. In some embodiments, a plurality of shielding wirebonds 130 can be arranged such that spacing between respective shielding wirebonds 130 provide side shielding functionality, in addition to upper shielding functionality (with the conductive layer 120 being electrically connected to the ground plane). In some embodiments, one or more shielding wirebonds 130 can be arranged so as to provide an electrical connection between the conductive layer 120 and the ground plane (thereby providing upper shielding functionality), but with little or no side shielding functionality.

Referring to the example of FIG. 7, in some embodiments, the conductive layer 120 can be a metal layer formed while the intermediate layer 122 is part of an array in an un-singulated form. In some embodiments, such a metal layer can be formed before a dicing step, by a number of metallization techniques such as deposition, plating, painting, etc. In some embodiments, the dicing step can involve only the intermediate layer 122 (in which case a singulated flip chip die can be attached to the singulated intermediate layer 122), or involve both of the intermediate layer 122 and an un-singulated array of die (in which case the metallization can be formed on the intermediate layer 122 before or after being attached to the un-singulated array of die).

Referring to the example of FIG. 7, in some embodiments, one or more shielding wirebonds 130 can be formed between the conductive layer 120 and a ground plane that is on or within the substrate 106. In some embodiments, such shielding wirebond(s) can be formed after mounting of an assembly (of the flip chip die, the intermediate layer 122 and the conductive layer 120 thereon) on the substrate 106.

For example, each shielding wirebond 130 can be formed between the upper surface of the conductive layer 120 on the intermediate layer 122 and a corresponding contact pad 132, and the contact pad 132 can be electrically connected to the ground plane of the substrate 106. Thus, each shielding wirebond 130 provides an electrical connection between the conductive layer 120 and the ground plane. In some embodiments, a plurality of shielding wirebonds 130 can be arranged such that spacing between respective shielding wirebonds 130 provide side shielding functionality, in addition to upper shielding functionality (with the conductive layer 120 being electrically connected to the ground plane). In some embodiments, one or more shielding wirebonds 130 can be arranged so as to provide an electrical connection between the conductive layer 120 and the ground plane (thereby providing upper shielding functionality), but with little or no side shielding functionality.

Figure 8:
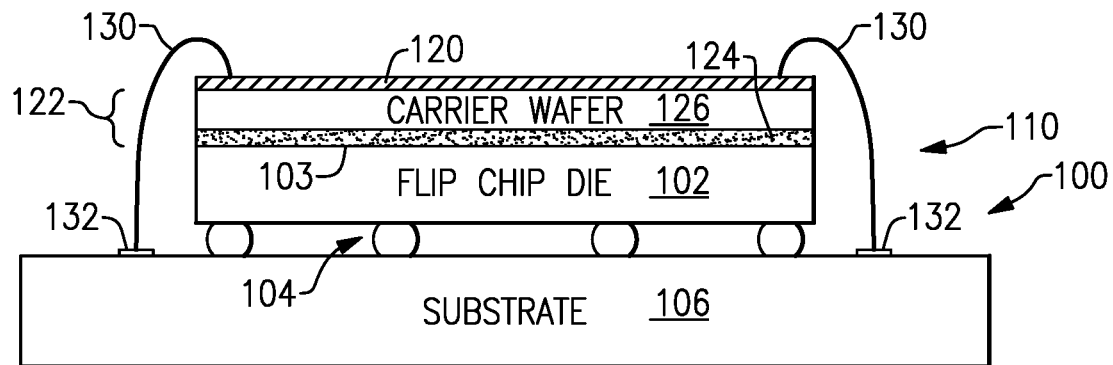
FIG. 8 shows a more specific example of the assembly of FIG. 7, where a carrier wafer layer and a corresponding conductive layer can have a footprint that is similar to a footprint of a flip chip die.
Figure 9:
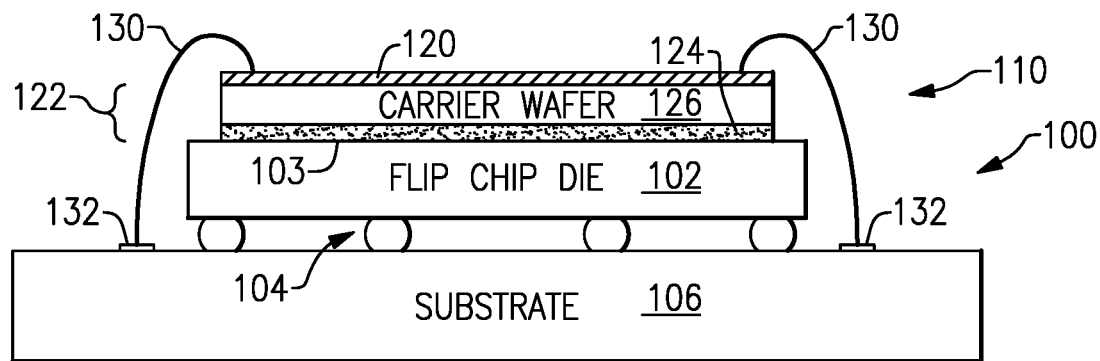
FIG. 9 shows another more specific example of the assembly of FIG. 7, where a carrier wafer layer and a corresponding conductive layer can have a footprint that is smaller than a footprint of a flip chip die.
Figure 10:
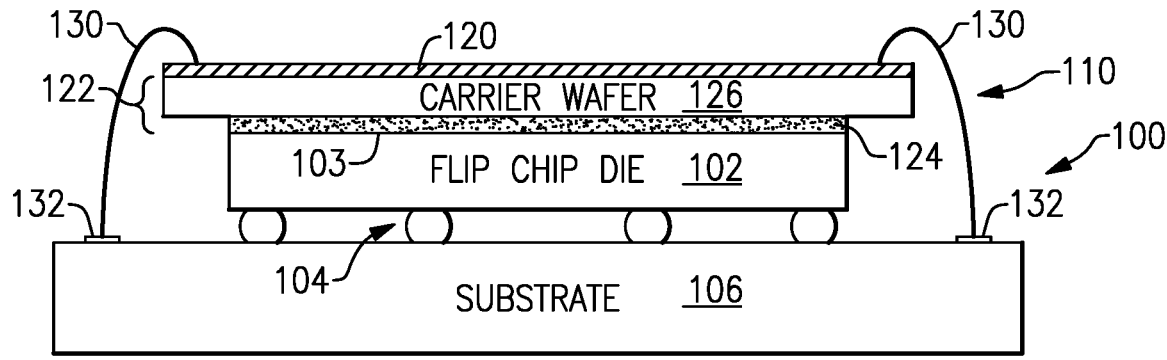
FIG. 10 shows yet another more specific example of the assembly of FIG. 7, where a carrier wafer layer and a corresponding conductive layer can have a footprint that is larger than a footprint of a flip chip die.

FIGS. 8-10 are more specific examples of the assembly 100 of FIG. 7, and show that in some embodiments, the intermediate layer 122 can include a carrier wafer layer 126. Such a carrier wafer layer can be, for example, a semiconductor (e.g., silicon) wafer layer, a glass wafer layer, etc. In some embodiments, the carrier wafer layer 126 can be attached to a back side 103 of a flip chip die 102 with, for example, a die attach epoxy or a die attach film. In FIGS. 8-10, such an attachment layer is indicated as 124.

FIGS. 8-10 show that the carrier wafer layer 126 and the corresponding conductive layer 120 can have different footprint dimensions relative to the footprint of the corresponding flip chip die 102. For example, FIG. 8 shows that in some embodiments, the carrier wafer layer 126 and the corresponding conductive layer 120 can have a footprint that is similar to the footprint of the flip chip die 102.

In another example, FIG. 9 shows that in some embodiments, the carrier wafer layer 126 and the corresponding conductive layer 120 can have a footprint that is smaller than the footprint of the flip chip die 102. Accordingly, a ledge can be defined along one or more edges of the flip chip die 102.

In yet another example, FIG. 10 shows that in some embodiments, the carrier wafer layer 126 and the corresponding conductive layer 120 can have a footprint that is larger than the footprint of the flip chip die 102. Accordingly, an overhang can be defined along one or more edges of the flip chip die 102.

As described herein, shielding wirebonds 130 in the examples of FIGS. 6-10 can be implemented to provide an electrical connection between a conductive layer (120) on the back side of a flip chip die (102) and a ground plane of the substrate (106). Such a configuration can provide shielding functionality for at least between regions within (e.g., 112 in FIG. 2) the flip chip die 102 and above (e.g., 114 in FIG. 2) the conductive layer 120. As also described herein, if such shielding wirebonds are arranged appropriately (e.g., spaced apart with sufficiently small separation distance between neighboring shielding wirebonds), then side shielding functionality can be provided.

Figure 11:
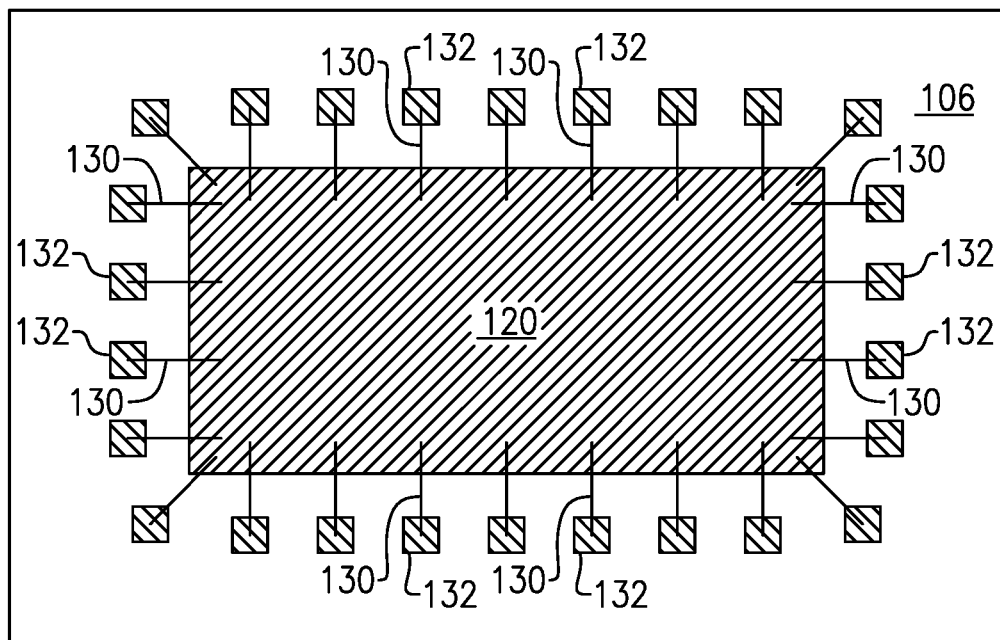
FIG. 11 shows an example where shielding functionality can be provided on a plurality of sides of a flip chip die.
Figure 12:
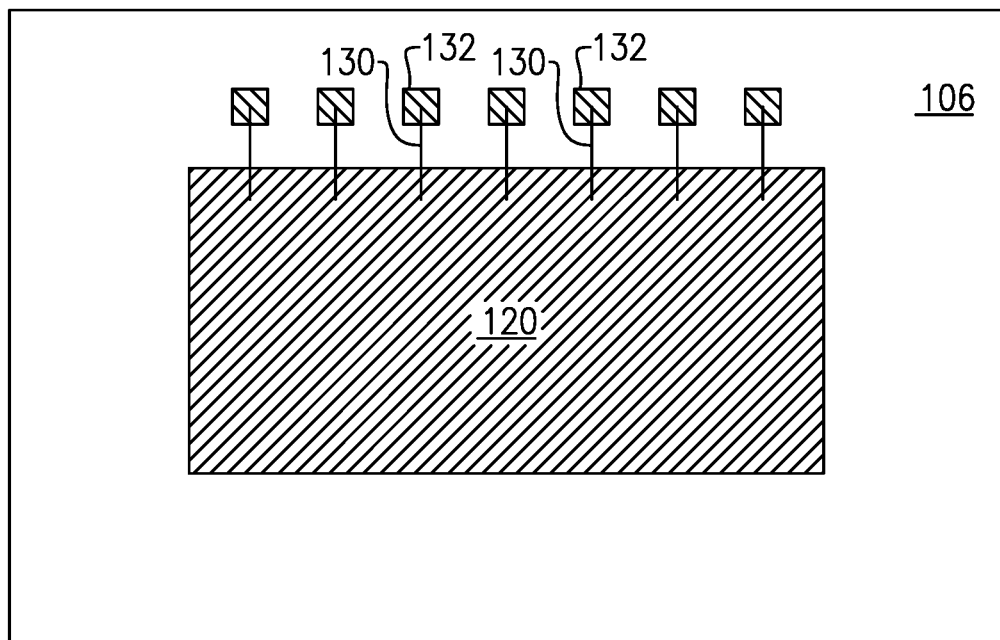
FIG. 12 shows an example where shielding functionality can be provided on a selected side of a flip chip die.

FIGS. 11 and 12 show examples where such side shielding functionality can be provided on one or more sides of a flip chip die. More particularly, FIGS. 11 and 12 show that in some embodiments, shielding wirebonds 130 as described herein can be implemented along some or all sides of a conductive layer 120 (that is above a corresponding flip chip die, with or without an intermediate layer). In the example of FIG. 11, shielding wirebonds 130 are arranged so as to generally surround the assembly of the conductive layer 120 and the corresponding flip chip die. Such a configuration can provide side shielding functionality on all sides of the flip chip die.

In the example of FIG. 12, shielding wirebonds 130 are arranged only along one side of the assembly of the conductive layer 120 and the corresponding flip chip die. Accordingly, such a configuration can provide side shielding functionality on the corresponding side of the flip chip die, but not on the other sides. It will be understood that one or more other sides of the flip chip die can also be shielded. It will also be understood that in some embodiments, a given side of the flip chip die can have partial or full coverage of side shielding functionality with a respective arrangement of one or more shielding wirebonds.

FIGS. 13-17 various examples where the shielding component 110 of FIG. 2 includes an absorber layer 140 implemented on a back side 103 of a flip chip die 102. In such examples, the flip chip die 102 is assumed to be mounted on a substrate 106 with a plurality of solder bumps 104. It will be understood that in some embodiments, the substrate 106 in the examples of FIGS. 13-17 can be any of the example substrates described herein in reference to FIGS. 3-5.

Figure 13:
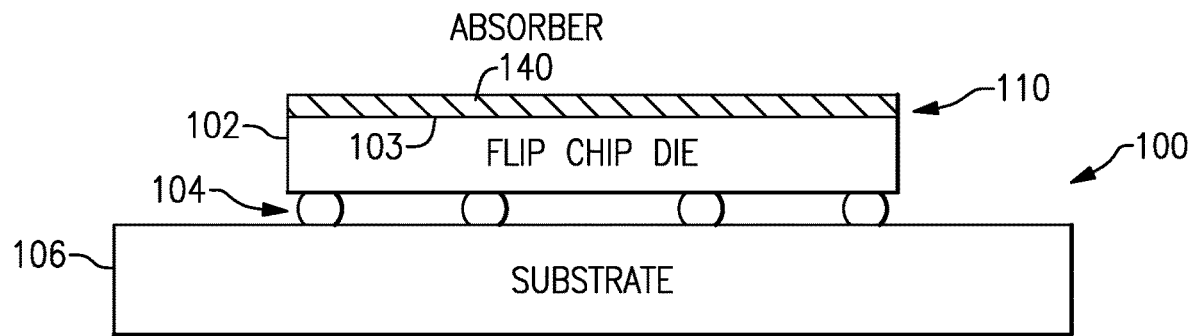
FIG. 13 shows that in some embodiments, an absorber layer for providing shielding functionality can be implemented directly on a back side of a flip chip die.
Figure 14:
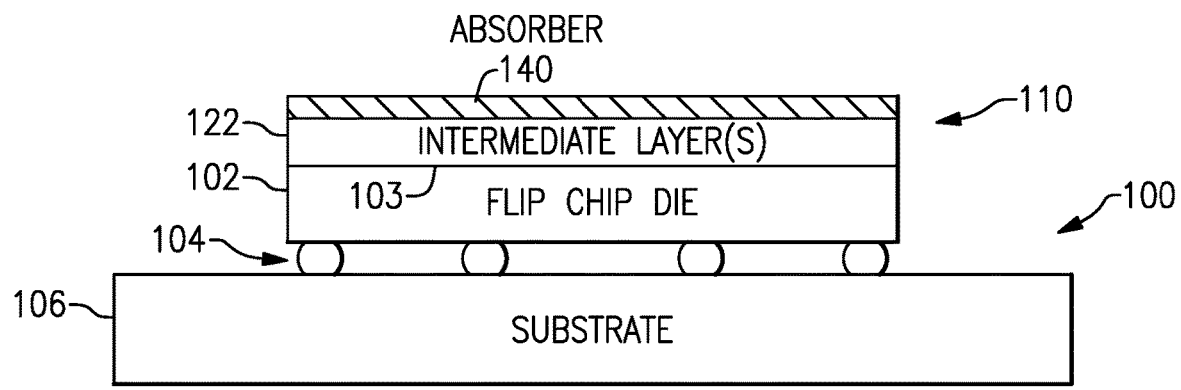
FIG. 14 shows that in some embodiments, an absorber layer for providing shielding functionality can be implemented on an intermediate layer, such that the intermediate layer is between a back side of a flip chip die and the absorber layer.

FIG. 13 shows that in some embodiments, an absorber layer 140 can be implemented directly on a back side 103 of a flip chip die 102. FIG. 14 shows that in some embodiments, an absorber layer 140 can be implemented on an intermediate layer 122, such that the intermediate layer 122 is between a back side 103 of a flip chip die 102 and the absorber layer 140.

Referring to the example of FIG. 13, in some embodiments, the absorber layer 140 can be formed (e.g., by deposition, spin-on, etc.) while the flip chip die 102 is part of an array of un-singulated die (e.g., in a wafer form). In some embodiments, such an absorber layer can be formed before a dicing step. Such a step for forming of absorber layer can be performed before or after a bumping step where solder bumps are formed.

Referring to the example of FIG. 14, in some embodiments, the absorber layer 140 can be formed (e.g., by deposition, spin-on, etc.) while the intermediate layer 122 is part of an array in an un-singulated form. In some embodiments, such an absorber layer can be formed before a dicing step. In some embodiments, the dicing step can involve only the intermediate layer 122 (in which case a singulated flip chip die can be attached to the singulated intermediate layer 122), or involve both of the intermediate layer 122 and an un-singulated array of die (in which case the absorber layer can be formed on the intermediate layer 122 before or after being attached to the un-singulated array of die).

Figure 15:
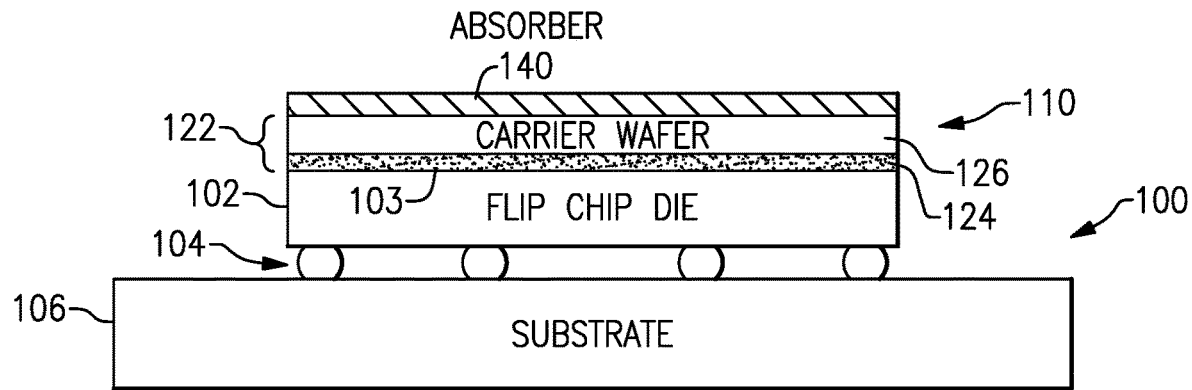
FIG. 15 shows a more specific example of the assembly of FIG. 14, where a carrier wafer layer and a corresponding absorber layer can have a footprint that is similar to a footprint of a flip chip die.
Figure 16:
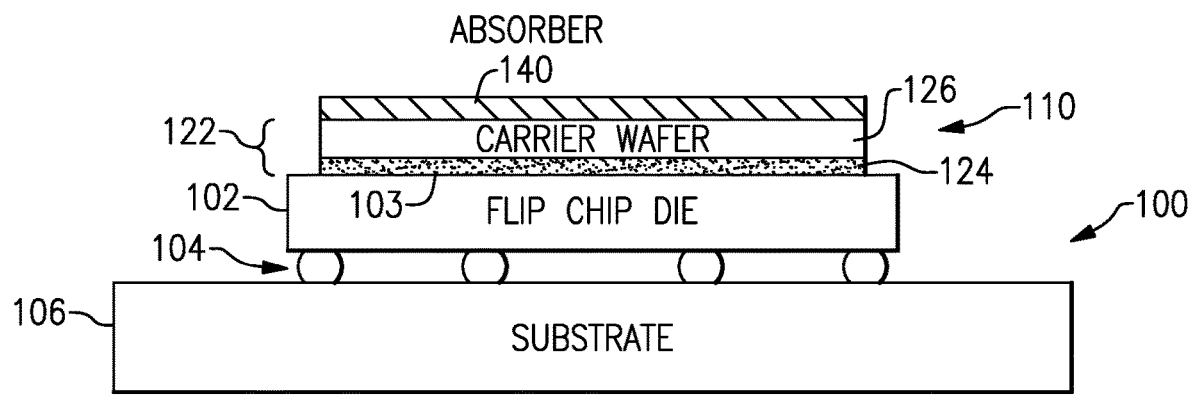
FIG. 16 shows another more specific example of the assembly of FIG. 14, where a carrier wafer layer and a corresponding absorber layer can have a footprint that is smaller than a footprint of a flip chip die.
Figure 17:
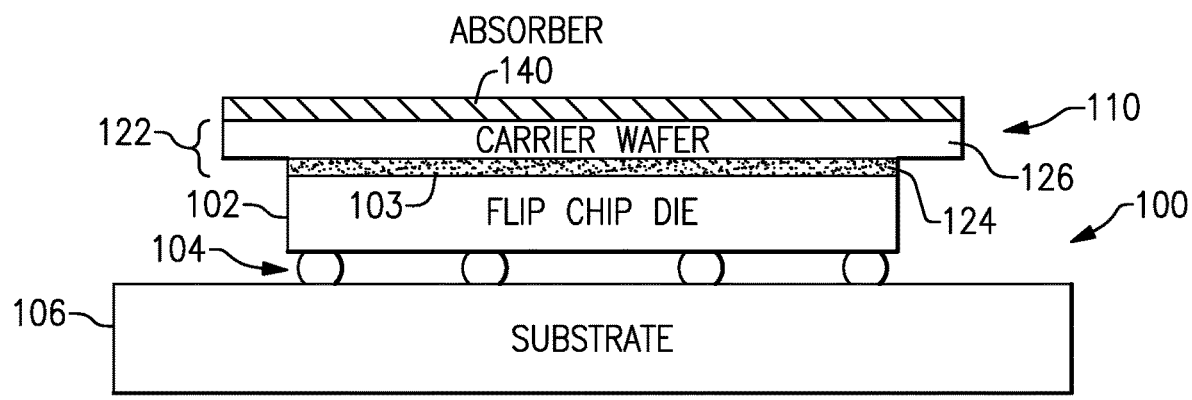
FIG. 17 shows yet another more specific example of the assembly of FIG. 14, where a carrier wafer layer and a corresponding absorber layer can have a footprint that is larger than a footprint of a flip chip die.

FIGS. 15-17 are more specific examples of the assembly 100 of FIG. 14, and show that in some embodiments, the intermediate layer 122 can include a carrier wafer layer 126. Such a carrier wafer layer can be, for example, a semiconductor (e.g., silicon) wafer layer, a glass wafer layer, etc. In some embodiments, the carrier wafer layer 126 can be attached to a back side 103 of a flip chip die 102 with, for example, a die attach epoxy or a die attach film. In FIGS. 15-17, such an attachment layer is indicated as 124.

FIGS. 15-17 show that the carrier wafer layer 126 and the corresponding absorber layer 140 can have different footprint dimensions relative to the footprint of the corresponding flip chip die 102. For example, FIG. 15 shows that in some embodiments, the carrier wafer layer 126 and the corresponding absorber layer 140 can have a footprint that is similar to the footprint of the flip chip die 102.

In another example, FIG. 16 shows that in some embodiments, the carrier wafer layer 126 and the corresponding absorber layer 140 can have a footprint that is smaller than the footprint of the flip chip die 102. Accordingly, a ledge can be defined along one or more edges of the flip chip die 102.

In yet another example, FIG. 17 shows that in some embodiments, the carrier wafer layer 126 and the corresponding absorber layer 140 can have a footprint that is larger than the footprint of the flip chip die 102. Accordingly, an overhang can be defined along one or more edges of the flip chip die 102.

In some embodiments, at least some portion of an assembly or device having one or more features as described herein can be processed while in an array format (e.g., un-singulated wafer format). For example, FIGS. 18A-18D show various steps in a process for fabricating a plurality of assemblies with each assembly including a flip chip die 102 and a conductive layer 120 (e.g., as in FIG. 6).

Figure 18A:
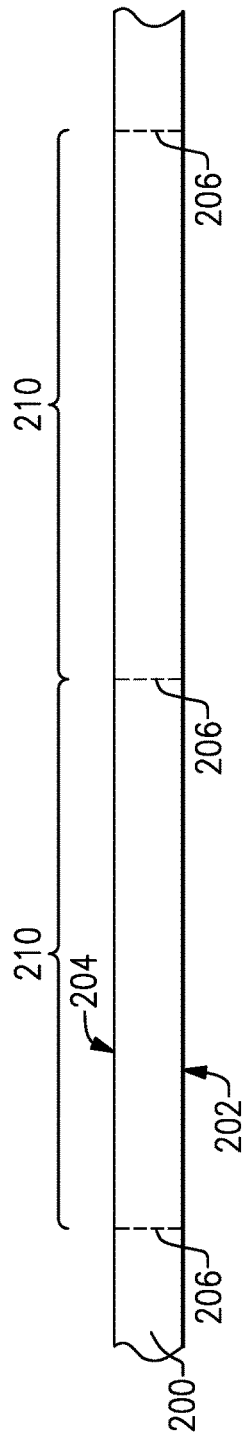
FIGS. 18A-18D show various example steps in a process for fabricating a plurality of assemblies with each assembly including a flip chip die and a conductive layer.

FIG. 18A shows a step where a wafer 200 can be provided or fabricated. Such a wafer is shown to include a plurality of individual flip chip units 210 that will eventually be singulated at or near boundaries 206. In the example of FIG. 18A, the wafer 200 is shown to include a front side 202 and a back side 204. For the purpose of description, it will be understood that an integrated circuit is already formed on the front side 202 of each individual flip chip unit 210, or can be formed after formation of a conductive layer on the back side 204 (in FIG. 18B as described herein).

Figure 18B:
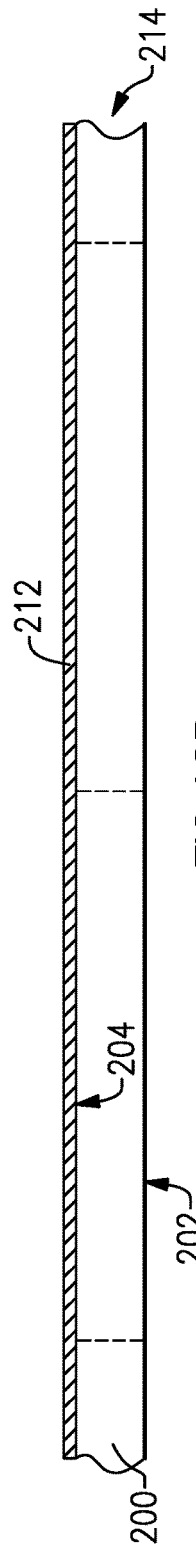

FIG. 18B shows a step where a conductive layer 212 can be formed over the back side 204 of the wafer 200, so as to form an assembly 214. Once the individual flip chip units 210 are singulated, respective portion of the conductive layer 212 becomes the conductive layer of, for example, FIG. 6.

Figure 18C:
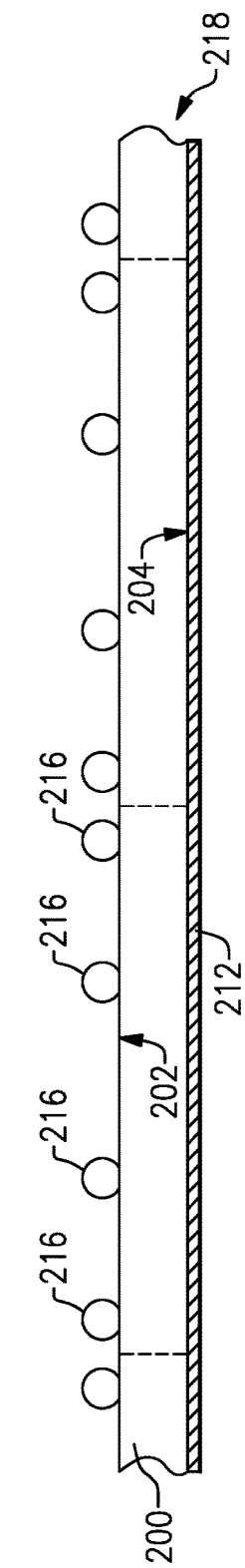

FIG. 18C shows a step where solder bumps 216 are formed on the front side 202 of the wafer 200, so as to form an assembly 218. Such solder bumps can include a set of solder bumps (e.g., 104 in FIG. 6) for each individual flip chip unit 210.

Figure 18D:
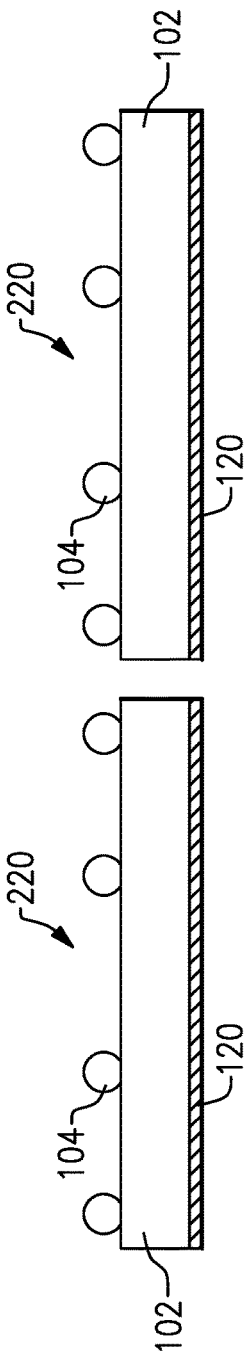

FIG. 18D shows a step where the individual flip chip units 210 are singulated to provide a plurality of separated flip chip units 220. Each of such units can be, for example, the assembly (of flip chip die 102, the conductive layer 120 and the solder bumps 104) of FIG. 6.

It will be understood that in some embodiments, a plurality of the flip chip units 220 of FIG. 18D can be further processed with an array format of a substrate. For example, suppose that the resulting assembly (e.g., 100 in FIG. 6) is a packaged module. In such an example context, the substrate array can be a panel having a plurality of individual regions that will become individual packaging substrates once singulated. A singulated flip chip unit (e.g., 220 in FIG. 18D) can be mounted on each of such regions, and additional process step(s) such as formation of shielding wirebonds (e.g., 130 in FIG. 6) can be performed on the mounted array of singulated flip chip units. Following such additional process step(s), singulation can be performed to yield a plurality of assemblies (e.g., 100 in FIG. 6).

In another example, FIGS. 19A-19D show various steps in a process for fabricating a plurality of assemblies with each assembly including a flip chip die 102, an intermediate layer 122 and a conductive layer 120 (e.g., as in FIG. 7).

FIG. 19A shows a step where an assembly of a flip chip wafer 200 and a carrier wafer 234 (attached with an attachment layer 232) can be provided or fabricated. Such an assembly is shown to include a plurality of individual units 230 that will eventually be singulated at or near boundaries 206. In the example of FIG. 19A, the wafer 200 is shown to include a front side 202 and a back side 204. For the purpose of description, it will be understood that an integrated circuit is already formed on the front side 202 of each individual unit 230, or can be formed after formation of a conductive layer on the carrier wafer 234 which is attached to the back side 204 of the flip chip wafer 200 (in FIG. 19B as described herein).

FIG. 19B shows a step where a conductive layer 236 can be formed on one side of the carrier wafer 234, with the other side of the carrier wafer 234 being attached to the back side 204 of the flip chip wafer 200, so as to form an assembly 238. Once the individual units 230 are singulated, respective portion of the conductive layer 236 becomes the conductive layer of, for example, FIG. 7.

FIG. 19C shows a step where solder bumps 238 are formed on the front side 202 of the flip chip wafer 200, so as to form an assembly 240. Such solder bumps can include a set of solder bumps (e.g., 104 in FIG. 7) for each individual unit 230.

FIG. 19D shows a step where the individual units 230 are singulated to provide a plurality of separated units 242. Each of such units can be, for example, the assembly (of flip chip die 102, the intermediate layer 122, the conductive layer 120 and the solder bumps 104) of FIG. 7.

It will be understood that in some embodiments, a plurality of the units 242 of FIG. 19D can be further processed with an array format of a substrate. For example, suppose that the resulting assembly (e.g., 100 in FIG. 7) is a packaged module. In such an example context, the substrate array can be a panel having a plurality of individual regions that will become individual packaging substrates once singulated. A singulated flip chip unit (e.g., 242 in FIG. 18D) can be mounted on each of such regions, and additional process step(s) such as formation of shielding wirebonds (e.g., 130 in FIG. 7) can be performed on the mounted array of singulated units. Following such additional process step(s), singulation can be performed to yield a plurality of assemblies (e.g., 100 in FIG. 7).

In the examples of FIGS. 18 and 19, the fabrication processes are described in the context of assemblies having a conductive layer (with or without an intermediate layer). It will be understood that in some embodiments, similar fabrication processes can also be implemented appropriately to yield assemblies having an absorber layer (with or without an intermediate layer).

Figure 20:
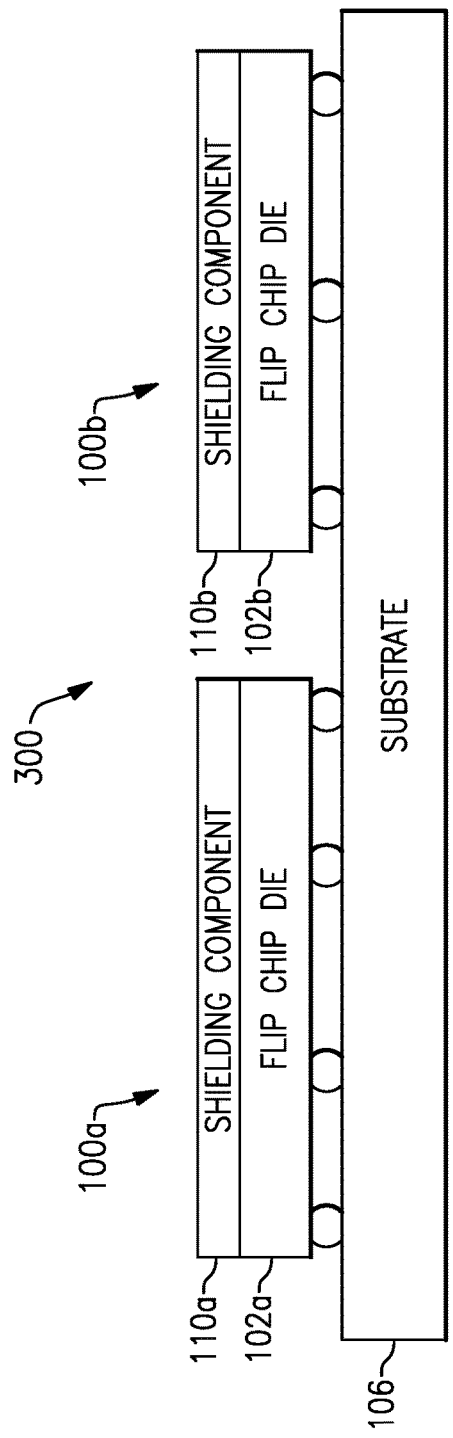
FIG. 20 shows that in some embodiments, a product such as a packaged module can include a plurality of assemblies, with each assembly having one or more features as described herein.

FIG. 20 shows that in some embodiments, a product such as a packaged module 300 can include a plurality of assemblies 100a, 100b each having one or more features as described herein. For example, the packaged module 300 of FIG. 20 is shown to include a packaging substrate 106, and a first assembly 100a having a flip chip die 102a and a corresponding shielding component 110a mounted on a respective portion of the packaging substrate 106. The packaged module 300 is shown to further include a second assembly 100b having a flip chip die 102b and a corresponding shielding component 110b mounted on a respective portion of the packaging substrate 106. In some embodiments, such a packaged module can also include an overmold implemented over the packaging substrate to thereby encapsulate and protect the flip chip die 102a, 102b and the respective shielding components 110a, 110b.

Configured in the foregoing manner, each flip chip die (102a or 102b) can be desirably shielded with respect to the other flip chip die, with respect to another location away from the flip chip die, or some combination thereof.

Figure 21:
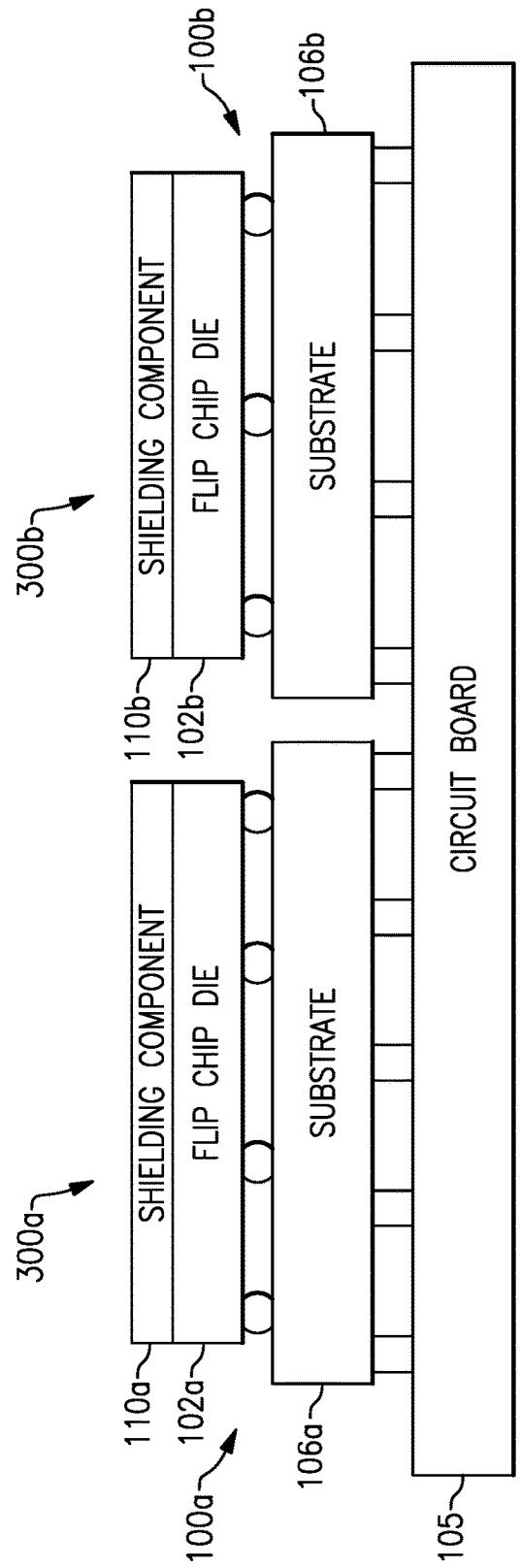
FIG. 21 shows that in some embodiments, a product such as an assembly on a circuit board can include a plurality of packaged modules, with each packaged module having one or more features as described herein.

In the example of FIG. 20, a single module is depicted as including a plurality of shielded assemblies 100a, 100b. In some product implementations, a plurality of flip chip die may also be positioned relative to each other, but as parts of separate packaged modules. For example, FIG. 21 shows that in some embodiments, a product such as an assembly on a circuit board 105 can include a plurality of packaged modules 300a, 300b each having one or more features as described herein. For example, the first packaged module 300a can includes a packaging substrate 106a, and a first assembly 100a having a flip chip die 102a and a corresponding shielding component 110a mounted on the packaging substrate 106a. Similarly, the second packaged module 300b can includes a packaging substrate 106b, and a second assembly 100b having a flip chip die 102b and a corresponding shielding component 110b mounted on the packaging substrate 106b. In some embodiments, each of such packaged modules can also include an overmold implemented over the packaging substrate to thereby encapsulate and protect the flip chip die and the respective shielding component.

Configured in the foregoing manner, each flip chip die (102a or 102b) can be desirably shielded with respect to the other flip chip die, with respect to another location away from the flip chip die, or some combination thereof.

In some implementations, a device having one or more features described herein can be included in an RF electronic device such as a wireless device. In some embodiments, such a wireless device can include, for example, a cellular phone, a smart-phone, a hand-held wireless device with or without phone functionality, a wireless tablet, etc.

Figure 22:
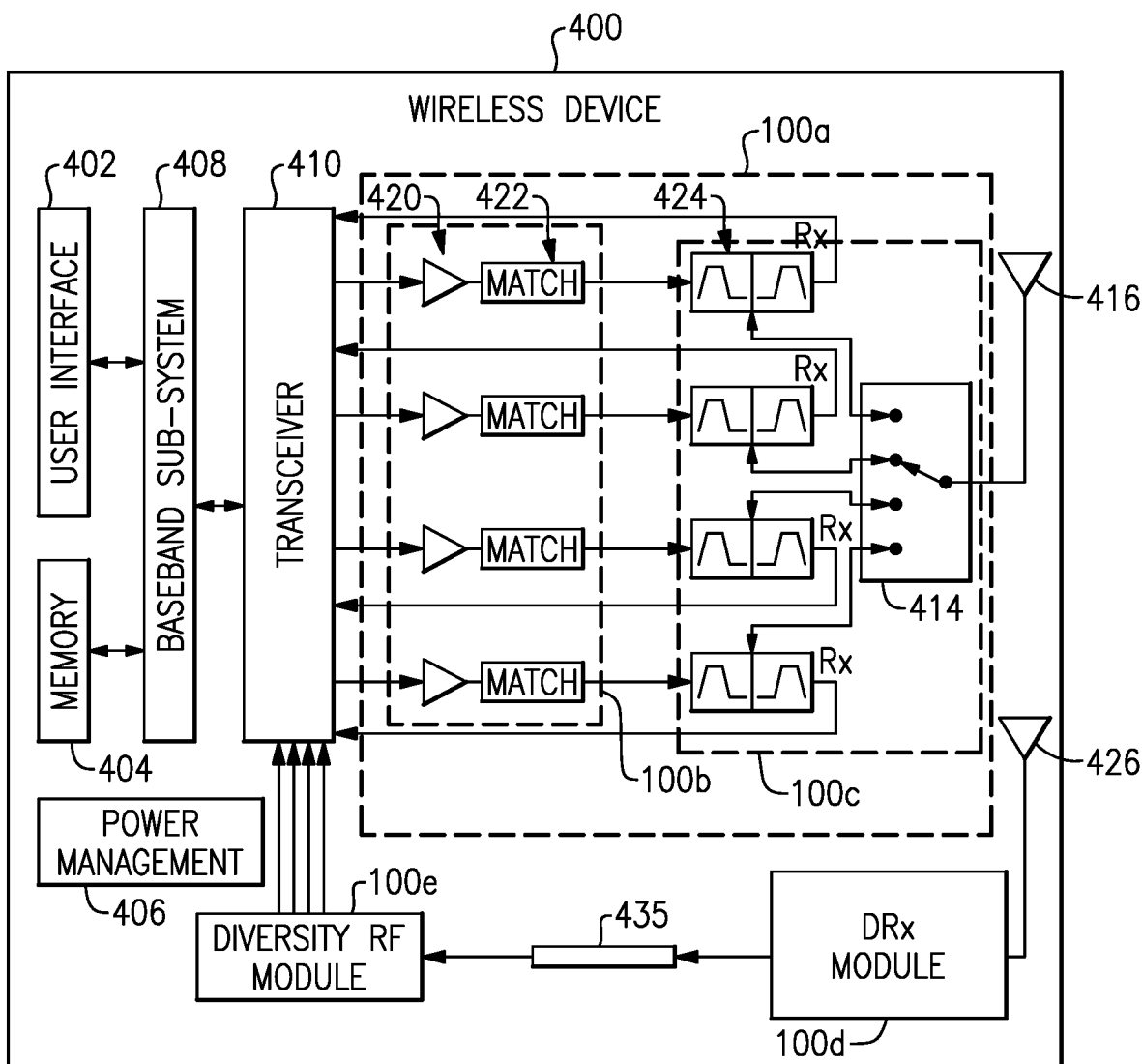
FIG. 22 depicts an example wireless device having one or more advantageous features described herein.

FIG. 22 depicts an example wireless device 400 having one or more advantageous features described herein. In the example of FIG. 20, a shielded RF module having one or more features as described herein can be implemented in a number of places. For example, a shielded RF module may be implemented as a front-end module (FEM) indicated as 100a. In another example, a shielded RF module may be implemented as a power amplifier module (PAM) indicated as 100b. In another example, a shielded RF module may be implemented as an antenna switch module (ASM) indicated as 100c. In another example, a shielded RF module may be implemented as a diversity receive (DRx) module indicated as 100d. It will be understood that a shielded RF module having one or more features as described herein can be implemented with other combinations of components.

Referring to FIG. 22, power amplifiers (PAs) 420 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 424. Such amplified and filtered signals can be routed to a primary antenna 416 through an antenna switch 414 for transmission. In some embodiments, the duplexers 424 can allow transmit and receive operations to be performed simultaneously using a common antenna (e.g., primary antenna 416). In FIG. 22, received signals are shown to be routed to "Rx" paths that can include, for example, a low-noise amplifier (LNA).

In the example of FIG. 22, the wireless device 400 also includes the diversity antenna 426 and the shielded DRx module 100d that receives signals from the diversity antenna 426. The shielded DRx module 100d processes the received signals and provides the processed signals via a transmission line 435 to a diversity RF module 411 that further processes the signal before feeding the signal to the transceiver 410.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A shielded assembly comprising:
   a substrate;
   a die having a front side and a back side, and including an integrated circuit implemented on the front side, the front side of the die mounted to the substrate;
   a carrier wafer layer disposed over the back side of the die;
   a conductive layer disposed over the carrier wafer layer; and
   a plurality of shielding wirebonds implemented to provide an electrical connection between the conductive layer and a ground plane of the substrate, such that the conductive layer and the plurality of shielding wirebonds provide electromagnetic shielding between a first region within or on the die and a second region away from the die.

2. The shielded assembly of claim 1 wherein the substrate includes a circuit board.

3. The shielded assembly of claim 2 wherein the circuit board includes a phone board.

4. The shielded assembly of claim 1 wherein the substrate includes a packaging substrate.

5. The shielded assembly of claim 4 wherein the shielded assembly is implemented as a packaged module.

6. The shielded assembly of claim 1 wherein the conductive layer is implemented directly on a surface of the carrier wafer layer.

7. The shielded assembly of claim 1 wherein the carrier wafer is attached to the back side of the die by an attachment layer.

8. The shielded assembly of claim 7 wherein the attachment layer includes a die attach epoxy layer or a die attach film.

9. The shielded assembly of claim 1 wherein the plurality of shielding wirebonds are arranged partially or fully around the die, with neighboring shielding wirebonds being spaced apart with sufficiently small separation distance to provide shielding functionality.

10. The shielded assembly of claim 1 wherein the conductive layer includes a metal layer.

11. A packaged module comprising:
    a packaging substrate configured to receive a plurality of components;
    a die having a front side and a back side, and including an integrated circuit implemented on the front side, the front side of the die mounted to the packaging substrate;
    a carrier wafer layer disposed over the back side of the die;
    a conductive layer disposed over the carrier wafer layer; and
    a plurality of shielding wirebonds implemented to provide an electrical connection between the conductive layer and a ground plane of the substrate, such that the conductive layer and the plurality of shielding wirebonds provide electromagnetic shielding between a first region within or on the die and a second region away from the die.

12. A radio-frequency device comprising:
    a radio circuit;
    a shielded assembly in communication with the radio circuit and configured to process a signal, the shielded assembly including a substrate, a die having a front side and a back side and including an integrated circuit implemented on the front side, the front side of the die mounted to the substrate, the shielded assembly further including a carrier wafer layer disposed over the back side of the die, and a conductive layer disposed over the carrier wafer layer, the shielded assembly further including a plurality of shielding wirebonds implemented to provide an electrical connection between the conductive layer and a ground plane of the substrate, such that the conductive layer and the plurality of shielding wirebonds provide electromagnetic shielding between a first region within or on the die and a second region away from the die; and
    an antenna in communication with the shielded assembly and configured to support either or both of transmit and receive operations.

13. The shielded assembly of claim 1 wherein the die is a flip chip die.

14. The packaged module of claim 11 wherein the die is a flip chip die.

15. The radio-frequency device of claim 12 wherein the die is a flip chip die.

* * * * *